United States Patent [19]
Su

[11] Patent Number: 5,528,451
[45] Date of Patent: Jun. 18, 1996

[54] EROSION RESISTANT ELECTROSTATIC CHUCK

[75] Inventor: Yuh-Jia Su, Cupertino, Calif.

[73] Assignee: Applied Materials, Inc, Santa Clara, Calif.

[21] Appl. No.: 333,455

[22] Filed: Nov. 2, 1994

[51] Int. Cl.⁶ .................................................. H02N 13/00
[52] U.S. Cl. ............................................................ 361/234
[58] Field of Search ........................... 279/128; 361/234; 269/8; 29/825, 829

[56] References Cited

U.S. PATENT DOCUMENTS

| | | |
|---|---|---|
| 4,184,188 | 1/1980 | Briglia . |
| 4,384,918 | 5/1983 | Abe . |
| 4,399,016 | 8/1983 | Tsukada et al. . |
| 4,771,730 | 9/1988 | Tezuka . |
| 5,221,403 | 6/1993 | Nozawa et al. .......................... 156/345 |
| 5,250,137 | 10/1993 | Arami et al. ............................ 156/345 |
| 5,255,153 | 10/1993 | Nozawa et al. .......................... 361/234 |

FOREIGN PATENT DOCUMENTS

| | | |
|---|---|---|
| 1-298721 | 12/1989 | Japan . |
| 2-27748 | 1/1990 | Japan . |

OTHER PUBLICATIONS

Klein, Allen J., "Curing Techniques for Composites," *Advanced Composites*, Mar./Apr. 1988, pp. 32–44.

"Data Sheet—Breathers and Bleeders," Data Sheet from Airtech International, Inc., Carson, California (1993).

"Kapton General Information," Technical Brochure from DuPont de Nemours Company, Wilmington, Delaware (1993).

"R/flex® 1100 High Temperature Materials," Data Sheet DS20903D, Rogers Corporation, Chandler, Arizona (1993).

U.S. patent application entitled, "An Electrostatic Chuck Having a Grooved Surface," by Roger J. Steger, filed Jul. 20, 1993 (Applied Materials Docket 260).

U.S. patent application entitled, "Electrostatic Chuck with Erosion–Resistant Electrode Connection," Ser. No. 08/199,916, filed Feb. 22, 1994.

U.S. patent application entitled, "Erosion Resistant Electrostatic Chuck," Ser. No. 08/199,402, filed Feb. 22, 1994.

U.S. patent application entitled, "Protective Coating for Dielectric Material on Wafer Support Used in Integrated Circuit Processing Apparatus and Method of Forming Same," Ser. No. 08/052,018, filed Apr. 22, 1993.

*Primary Examiner*—Fritz M. Fleming
*Attorney, Agent, or Firm*—Ashok K. Janah

[57] ABSTRACT

An erosion resistant electrostatic chuck (20) comprises an electrostatic member (22) supported by a base (24), the base (24) having a peripheral edge (26). A cutaway segment (28) in the peripheral edge (26) of the base holds an insulated electrical connector (30) for electrically connecting the electrostatic member (22) on the chuck (20) to a voltage supply (62) in a process chamber (36). A removable plug (40) is in the cutaway (28), and covers a portion of the insulated electrical connector (30) for protecting the electrical connector from erosion in the process chamber (36). Preferably, the removable plug (40) is substantially L-shaped with the bottom leg of the "L" in the bottom of the cutaway (28), and the upstanding leg of the "L" abutting against the side of the cutaway (28).

17 Claims, 4 Drawing Sheets

EROSION RESISTANT ELECTROSTATIC CHUCK

BACKGROUND

This invention relates to an erosion resistant electrostatic chuck for holding substrates in process chambers.

In semiconductor fabrication processes, electrostatic chucks are used to hold substrates, such as silicon wafers, during processing of the substrate. Electrostatic chucks are generally described in, for example, U.S. Pat. No. 4,399, 016, to Tokuda; U.S. Pat. No. 4,384,918, to Abe; and U.S. patent application Ser. No. 08/189,562, entitled "Electrostatic Chuck" by Shamouilian, et al., filed on Jan. 31, 1994—all of which are incorporated herein by reference.

A typical electrostatic chuck comprises a base adapted to be secured to a support in a process chamber. An electrostatic member is on the base, the electrostatic member typically comprising an insulator with an electrode therein. An insulated electrical connector extends over the edge of the base, and connects the electrostatic member on the base to a high voltage supply in the process chamber. The electrical connector is typically insulated by an insulative polymer, such as polyimide.

During its use, the chuck is secured to a support in the process chamber. A substrate is placed on the chuck, and the electrostatic member of the chuck is electrically biased with respect to the substrate by an electrical voltage applied by a voltage source in the process chamber. Electrostatic charge accumulates in the electrostatic member of the chuck and on the substrate, and the resultant electrostatic force holds the substrate to the chuck.

The use of polymers, such as polyimides, to insulate the electrical connector of the chuck limits the lifetime of the chuck in corrosive semiconductor fabrication processes, particularly in processes using oxygen containing gases and plasmas. Oxygen containing gases and plasmas are used for a variety of tasks, including for the etching of substrates and cleaning of process chamber walls. These corrosive environments rapidly erode the exposed portions of the electrical connector of the chuck, which extend along the edge of the chuck. The exposed portions of the electrical connector can erode in as few as a thousand process cycles.

Erosion of the electrical connector at even a single point is sufficient to cause arcing between the electrode and the plasma, resulting in failure of the chuck, and requiring replacement of the entire chuck. Frequent replacement of chucks is expensive and slows down the fabrication process. Also, if the chuck fails during processing of the substrate, the entire substrate can be lost, at a cost of several thousands of dollars.

Although alternative insulators, such as silicon oxide based insulators, can be used to protect chucks from oxygen containing processes, these materials have other inherent limitations. For example, silicon oxide based insulators rapidly corrode in processes that use fluorine containing gases, such as fluorocarbon gases. Also, silicon oxide based insulators are more difficult and expensive to manufacture.

Thus, it is desirable to have electrostatic chuck that is substantially resistant to erosion in erosive gaseous environments. It is further desirable to have a chuck that can be inexpensively fabricated using conventional fabrication equipment.

SUMMARY

The electrostatic chuck of the present invention satisfies these needs. The chuck comprises an electrostatic member supported by a base, the base having a peripheral edge. A cutaway segment in the peripheral edge of the base holds an insulated electrical connector for electrically connecting the electrostatic member on the chuck to the voltage supply in the process chamber. A removable plug in the cutaway covers a portion of the insulated electrical connector and protects the electrical connector from erosion in the process chamber.

Preferably, the removable plug comprises a substantially erosion resistant polymer, such as a polyimide. Preferably, the removable plug is substantially L-shaped with the bottom leg of the "L" in the bottom of the cutaway and the upstanding leg of the "L" abutting against the side of the cutaway.

DRAWINGS

These and other features, aspects, and advantages of the present invention will become better understood with regard to the following description, appended claims, and accompanying drawings, where:

DESCRIPTION

Figure 1:
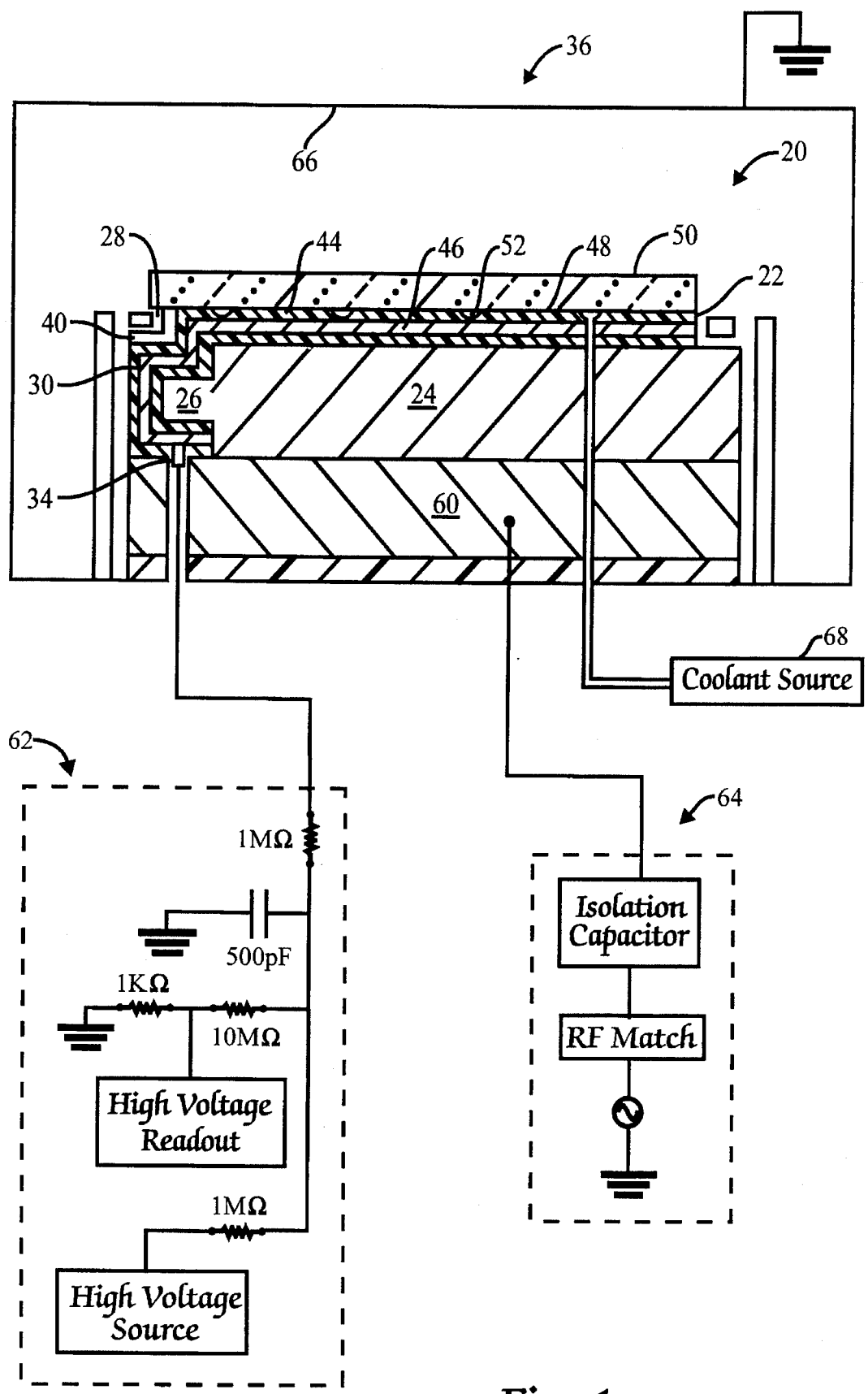
FIG. 1 is a schematic view, partly in cross-section, of a process chamber containing an electrostatic chuck according to the present invention.
Figure 2:
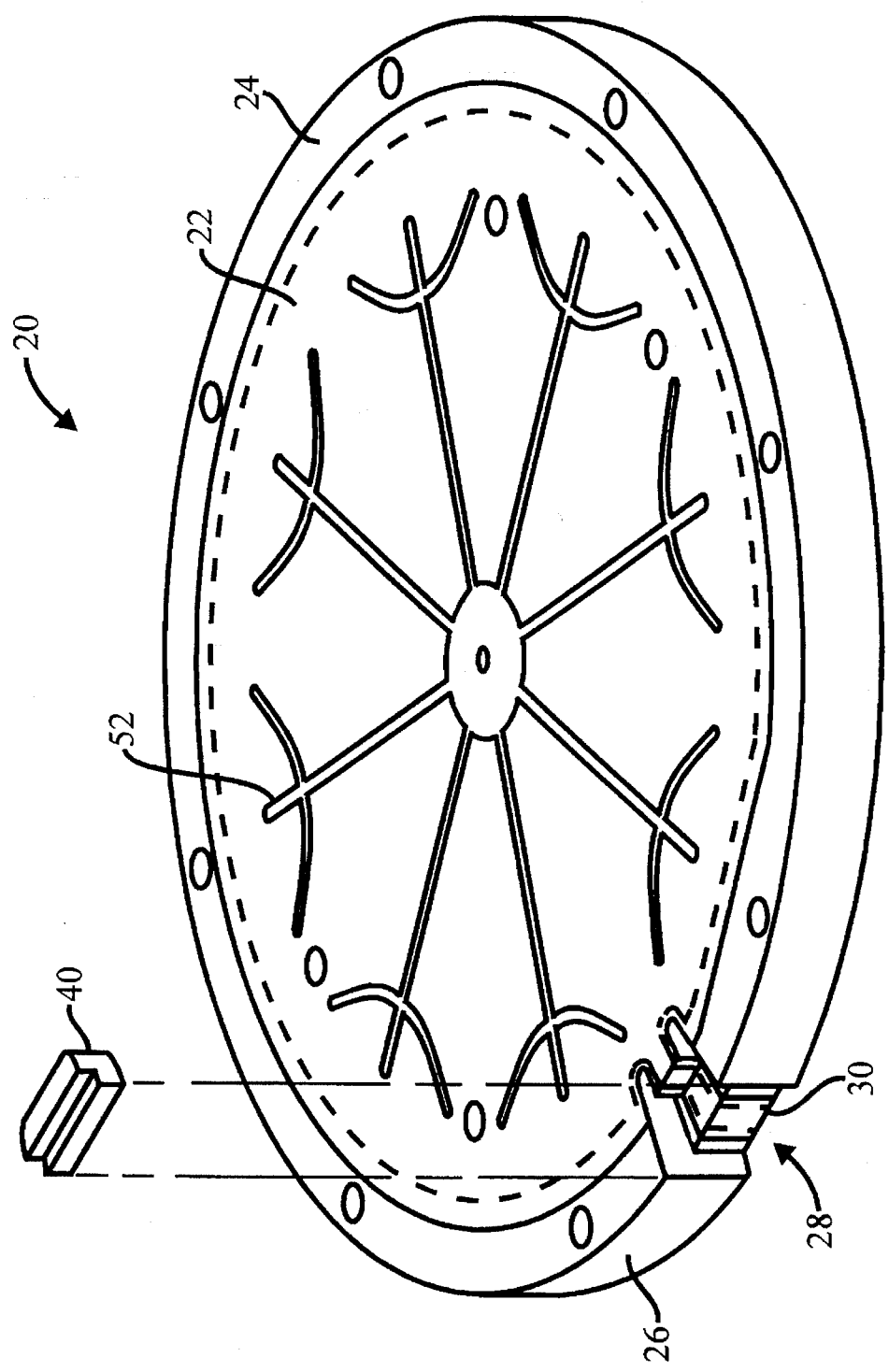
FIG. 2 is an exploded perspective view of the electrostatic chuck of FIG. 1 showing a removable plug sized to cover the electrical connector of the chuck.

With reference to FIGS. 1 and 2, an electrostatic chuck 20 according to this invention generally comprises an electrostatic member 22, supported by a base 24. The base 24 has a peripheral edge 26, with a cutaway segment 28 in the peripheral edge 26. An insulated electrical connector 30 in the cutaway 28, extends around a portion of the peripheral edge 26 of the base, and is provided for electrically connecting the electrostatic member 22 to a voltage supply terminal 34 in a process chamber 36. A removable plug 40 in the cutaway 28 covers a portion of the electrical connector 30 for protecting the electrical connector 30 from erosion in a process chamber 36.

Figure 3:
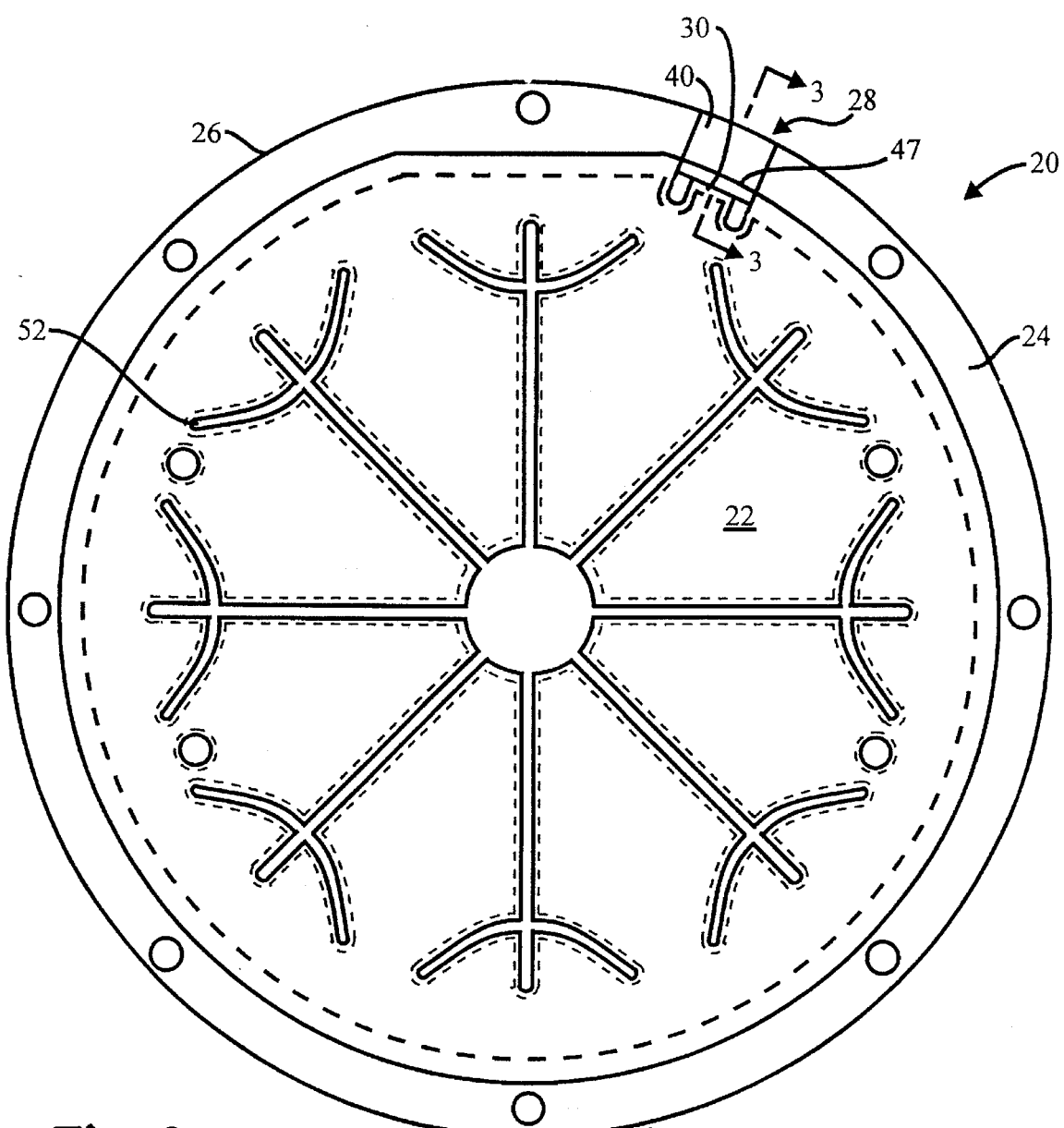
FIG. 3 is a top plan view of the electrostatic chuck of FIG. 2, showing the removable plug in the cutaway segment of the electrostatic chuck.
Figure 4:
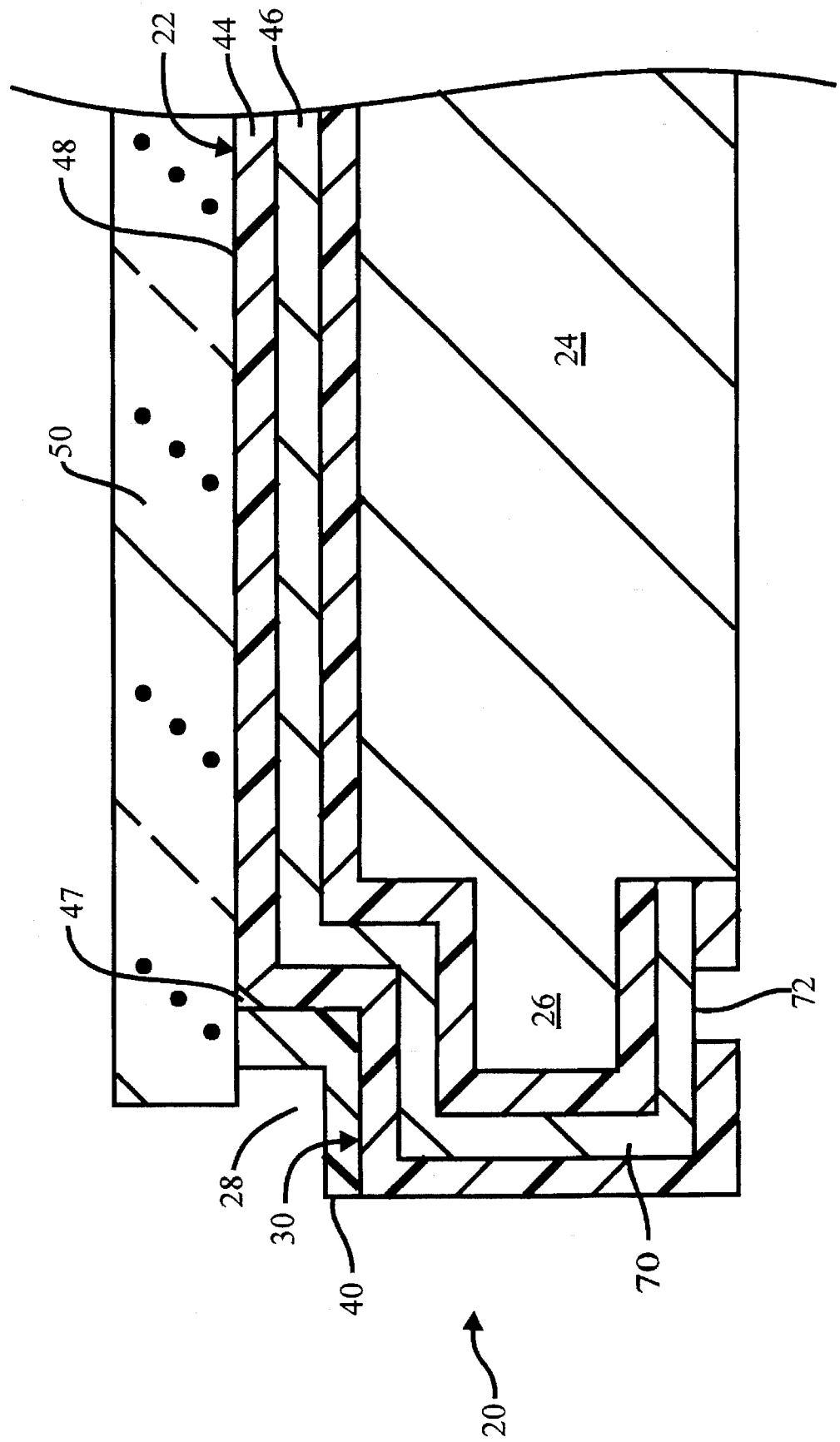
FIG. 4 is a partial sectional, side elevational view of the electrostatic chuck of FIG. 3 at section 3—3 in FIG. 3 showing the removable plug covering the electrical connector of the chuck.

The electrostatic member 22 typically comprises an insulator 44 with an electrode 46 therein, as shown in FIG. 4, and has an upper surface 48 adapted to support a substrate 50 thereon. The upper surface 48 can have grooves 52 as shown in FIGS. 1 and 3, for holding a coolant gas therein, for cooling a substrate held by the chuck 20.

With reference to FIG. 1, operation of the chuck 20 of the present invention will now be described. FIG. 1 shows a typical process chamber 36 for processing a substrate 50, such as a silicon wafer. The particular embodiment of the process chamber 36 shown herein is suitable for plasma processing of substrates 50, and is provided only to illustrate operation of the chuck 20, and should not be used to limit the scope of the invention.

During its use, the electrostatic chuck 20 is positioned on a support 60 in a process chamber 36. The electrical connector 30 of the chuck 20 electrically engages a voltage supply terminal 34 on the support 60. A first voltage supply 62 is connected to the voltage supply terminal 34, and provides a voltage to the electrostatic member 22 for operating the chuck 20. The first voltage supply 62 typically comprises a high voltage DC source of about 1000 to 3000 volts, connected to a high voltage readout, through a 10 MΩ resistor. The 1 MΩ resistors in the circuit limit the current flowing though the circuit, and a 500 pF capacitor is provided as an alternating current filter.

A second voltage supply 64 is connected to the support 60 in the chamber 36. The support 60 is typically made from an electrically conductive metal and functions as a process electrode for forming a plasma in the chamber 36. A quartz insulative cylinder 65 surrounds the support as shown in FIG. 1. The second voltage supply 64 is provided for electrically biasing the support 60 with respect to an electrically grounded surface 66 in the chamber 36, to form a plasma in the chamber 36. The second voltage supply 64 is conventional and generally comprises an RF impedance that matches the impedance of the process chamber 36 to the impedance of the line voltage, in series with an isolation capacitor, as shown in FIG. 1.

A coolant source 68 can be used to provide coolant gas to the grooves 52 to remove heat from the substrate 50, to maintain the substrate 50 at a substantially constant temperature.

When a substrate 50 is placed on the chuck 20, and the electrostatic member 22 is electrically biased with respect to the substrate 50 by the first voltage supply 62, electrostatic charge accumulates in the substrate 50 and in the electrostatic member 22, causing the substrate to be electrostatically held to the chuck 20.

The removable plug 40 covers a portion of the electrical connector 30 of the chuck 20, thereby reducing erosion of the electrical connector 30 by the erosive process gases in the process chamber 36. To further increase the erosion resistance of the chuck, an erosion resistant film 47 can be interposed between the removable plug 40 and the insulated electrical connector 30 to seal the gaps therebetween. The erosion film 47 typically comprises a polymeric film, such as polyimide "KAPTON" film, fabricated by DuPont de Nemours Company, Wilmington, Del. The erosion resistant film 47 seals the gaps around the removable plug 40, thereby preventing the erosive gases in the process chamber 36 from eroding the electrical connector 30. The reduced erosion of the electrical connector 30 provides a chuck having a longer lifetime.

The corrosion resistance of the chuck 20 can be further enhanced by directing a nonreactive gas, such as inert gases, such as helium or oxygen, onto the peripheral portions of the electrostatic member 22. Typically, the nonreactive gas is directed around the peripheral portions of the electrostatic member 22 using a circumferential manifold having a plurality of holes therein (not shown), as disclosed in application Ser. No. 08/199,916 entitled "Electrostatic Chuck with Erosion-Resistant Electrode Connection," filed Feb. 22, 1994, by Shamouilian, et al.

Particular aspects of the chuck 20 will now be discussed.

Base

The base 24 of the chuck 20 is provided for supporting the electrostatic member 22 thereon, as shown in FIG. 1. Generally, the base 24 has a shape and size corresponding to the shape and size of the substrate 50 to maximize heat transfer between the base 24 and the substrate 50, and to provide a wide surface for holding the substrate 50. For example, if the substrate 50 is disk shaped, a right cylindrically shaped base 24 is preferred. Alternatively, the base 24 can have a shape different from the shape of the substrate 50 or a size different from the size of the substrate 50. Typically, the base 24 is made from aluminum and has a right cylindrical shape, with a diameter of about 100 mm to 225 mm (4 to 9 inches), and a thickness of about 1.5 to 2 cm.

The base 24 has a peripheral edge 26 with a cutaway 28 in a segment of the peripheral edge. The cutaway 28 is sized to hold the electrical connector 30 therein. Typically, the cutaway 28 extends about 5 to 20 mm into the base from the peripheral edge 26 of the base, and typically, the cutaway 28 is about 5 to 20 mm wide, and about 5 to 10 mm deep.

Electrostatic Member

The electrostatic member 22 typically comprises an insulator 44 with an electrode 46 therein. The insulator 44 is sized sufficiently large to enclose the electrode 46. Typically, the insulator 44 comprises a polymeric material, such as polyimide, polyketone, polyetherketone, polysulfone, polycarbonate, polystyrene, nylon, polyvinylchloride, polypropylene, polyetherketones, polyethersulfone, polyethylene terephthalate, fluoroethylene propylene copolymers, cellulose, triacetates, silicone, and rubber. Preferably, the insulator 44 comprises a polyimide.

The overall thickness of the insulator 44 varies according to the electrical resistivity and dielectric constant of the insulative material used to form the insulator 44. Typically, the insulator 44 has a resistivity ranging from about $10^{13}$ Ω/cm to $10^{20}$ Ω/cm, and a dielectric constant of at least about 2, and more preferably at least about 3. When the insulator 44 has a dielectric constant of about 3.5, the entire insulator 44 is typically about 10 µm to about 500 µm thick, and more typically from about 100 µm to about 300 µm thick. When a polyimide is used as the insulator 44, the insulator has a dielectric breakdown strength of at least about 100 volts/mil (3.9 volts/micron), and more typically at least about 1000 volts/mil (39 volts/micron).

Preferably, the insulator 44 is resistant to temperatures in excess of 50° C., and more preferably resistant to temperatures in excess of 100° C., so that the chuck 20 can be used for processes where the substrate 50 is heated. Also, preferably, the insulator 44 has a high thermal conductivity so that heat generated in the substrate 50 during processing can dissipate through the chuck 20. The thermal conductivity of the insulator 44 should be at least about 0.10 Watts/m/°K., to allow sufficient heat transfer to preclude overheating of the substrate 50.

The insulator 44 can also include a high thermal conductivity filler material, such as diamond, alumina, zirconium boride, boron nitride, and aluminum nitride for increasing the thermal conductivity and resistance to plasma corrosion. Preferably the filler material is a powder with an average particle size of less than about 10 µm. Typically, the filler is dispersed in the insulative material in a volumetric ratio from about 10% to 80%, and more typically from about 20% to 50%.

Preferably, the insulator 44 has spaced apart grooves 52 therethrough, as shown in FIG. 2. The grooves 52 can also be on the upper surface 48 of the insulator as shown in FIG. 1. The grooves 52 are sized and distributed to hold coolant from a coolant source 68 for cooling the substrate 50. Typically, the grooves 52 form a pattern of intersecting channels, the channels lying between features of the electrostatic member 22, as described below. Alternative groove patterns are described in aforementioned U.S. patent application Ser. No. 08/189,562.

Additionally, a protective coating (not shown) can be applied on the upper surface 48 of the insulator 44 to protect the insulator 44 from chemical degradation when the chuck 20 is used in corrosive and erosive processing environments. Preferred protective coatings and processes for their fabrication are described in more detail in for example U.S. patent application Ser. No. 08/052,018, filed on Feb. 22, 1993, entitled "Protective Coating for Dielectric Material of Wafer Support Used in Integrated Circuit Processing Apparatus and Method of Forming the Same," by Wu, et al., which is incorporated herein by this reference.

The shape and size of the electrode 46 in the insulator 44 also varies according to the size and shape of the substrate 50. For example, as shown in the drawings, if the substrate 50 is disc-shaped, the electrode 46 is also disc-shaped to maximize the area of the electrode in contact with the substrate 50. Typically, the electrode 46 is made from an electrically conductive material, such as metal, for example, copper, nickel, chromium, aluminum, iron, and alloys thereof. Typically, the thickness of the electrode 46 is from about 1 µm to 100 µm, and more typically is from about 1 µm to 50 µm.

The electrode 46 can be continuous as shown in FIG. 1, or can be patterned as shown in FIG. 2. Preferably, the electrode 46 is patterned into one of several alternative configurations. In one patterned configuration, the electrode 46 forms interconnected features, the features sized so that the coolant grooves 52 can be formed between the electrode features. In another patterned configuration, the patterned electrode 46 comprises at least one pair of electrodes, so that the electrode 46 can function as a bipolar electrode. Suitable bipolar electrode configurations are disclosed in U.S. Pat. Nos. 4,384,918 to Abe; and 4,399,016 to Tsukada, et al.— both of which are incorporated herein by reference. When a bipolar electrode 46 configuration is used, voltages are applied to each of the pair of electrodes, to maintain the pair of electrodes at opposite polarities. The bipolar electrode configurations allow accumulation of electrostatic charge in the substrate 50, without electrically biasing the substrate. Bipolar electrode configurations can be advantageous when the chuck 20 is used for nonplasma processes, where there are no charged plasmas species that serve as charge carriers for electrically biasing the substrate 50.

The electrical connector 30 is electrically connected to the electrode 46 of the electrostatic member 22, and is provided for connecting the electrode 46 to the first voltage supply 62. Typically, the electrical connector 30 comprises an electrical lead 70 and an electrical contact 72. The electrical lead 70 extends along the peripheral edge 26 of the base, so that the electrical contact 72 is disposed below the base 24. The electrical lead 70 is typically from about 20 mm to about 40 mm in length, and has a width of about 4 mm to about 7 mm. The electrical contact 72 is shaped and sized sufficiently large to electrically engage the voltage supply terminal 34 on the support 60, without causing arcing of the high voltage applied therethrough. Typically, the electrical contact 72 is disk-shaped with an area of from about 75 to about 150 sq. min.

Typically, the electrical connector 30 is an integral extension of the electrode 46. By integral extension it is meant that the electrical connector 30 and electrode 46 are fabricated from a unitary electrically conductive member, such as a metal sheet or layer. Typically, a continuous sheet of conductive metal is cut out, by stamping or pressing to form the electrode 46 and electrical connector 30.

The removable plug 40 is sized to fit in the cutaway segment 28 of the base 24 to cover the electrical connector 30 in the cutaway 28. Typically, the cutaway segment 28 is L-shaped with a bottom and a side, therefore, typically the removable plug 40 is also substantially L-shaped, with the bottom leg of the "L" sized to fit in the bottom of the cutaway and the upstanding leg of the "L" sized to abut against the side of the cutaway 28, as shown in FIG. 4.

The removable plug 40 can be made from any suitable corrosion resistant material including ceramic, metal, and polymeric materials. Ceramic materials, by way of example, include $SiO_2$, $Al_2O_3$, and AlN. A suitable metal is anodized aluminum. Suitable erosion resistant polymers include polyimide, polyketone, polyetherketone, polysulfone, polycarbonate, polystyrene, nylon, polyvinylchloride, polypropylene, polyetherketones, polyethersulfone, polyethylene terephthalate, fluoroethylene propylene copolymers, cellulose, triacetates, silicone, and rubber.

The removable plug 40 of the present invention has several advantages. First, the removable plug 40 covers the exposed portions of the electrical connector 30, thereby protecting the electrical connector from erosion by the erosive environment in the process chamber 36. Also, when the removable plug is eroded, the plug 40 can be easily replaced with a new plug 40 to extend the lifetime of the chuck 20. For these reasons, the chuck 20 of the present invention is a significant improvement over prior art chucks.

Method of Manufacture

A preferred process for making an electrostatic chuck 20 according to the present invention, is described below.

The base 24 of the chuck 20 is typically machined from an aluminum plate, cut into a right cylindrical shape with a thickness of about 1.5 to 1.8 cm and a diameter of about 100 to 300 mm, to match the diameter of the substrate 50 which typically ranges from about 127 to about 203 mm (5–8 inches). The top and bottom surfaces of the aluminum plate are ground using conventional aluminum grinding techniques, until the surface roughness of the plate is less than about 1 micron. Surface grinding is essential for the base 24 to uniformly contact the support 60 of the process chamber 36, and the substrate 50 placed on the base 24, to allow for efficient thermal transfer between the substrate 50 and the support 60. After grinding, the plate is thoroughly cleaned to remove grinding debris. The cutaway 28 is formed in the base 24 by machining the peripheral edge 26 of the base to the desired dimensions, by conventional machining techniques, such as milling.

The electrostatic member 22 comprising the insulator 44 containing the electrode 46 therein, and having an electrical connector 30 integral with the electrode 46, is separately fabricated from a laminate member comprising an electrically conductive layer sandwiched between two insulative layers. Commercially available laminate members can be used as described below, or the laminate member can be fabricated using one of the methods herein.

After the laminate member is formed, the laminate is cut to form the electrode 26 and electrical connector 30 that is an integral extension of the electrode 46, by stamping, punching or pressing out the electrode 46 and electrical connector 30 from the laminate member. Preferably, the electrode 46 is cut out to form a pattern of interconnected grooves 52 in the electrode, as shown in FIG. 3, the grooves 52 sized to hold a coolant to cool a substrate placed on the chuck 20.

After the electrical connector 30 is cut out, a portion of the insulator on the electrical connector 30 is removed by peeling off the insulator layer to expose the underlying electrically conductive layer thereby forming the electrical contact 72. The electrical lead 70 of the electrical connector is then affixed in the cutaway 28 of the base using a conventional pressure or temperature sensitive adhesives. The electrical contact 72 is positioned on the bottom of the base 24 so that when the chuck is placed on the support 60 in the process chamber 36, the electrical contact 72 electrically engages the voltage supply terminal 34 on the support. The laminate member is then adhered to the base 24 of the chuck, using conventional pressure or temperature sensitive adhesives, such as polyimides. Thereafter, the electrical contact 72 is adhered to the bottom of the base of the chuck 20.

The removable plug 40 can be formed by injection molding or machining polyimide into the desired configuration using conventional techniques. The removable plug 40 is secured over the electrical connector using an adhesive or by clamping the plug 40 to the chuck 20, using suitable screws or clamps.

The laminate member used to form the chuck 20 can be formed by many different methods. A preferred method of forming the laminate member uses a multilayer film comprising an insulative layer and an electrically conductive electrode layer, such as "R/FLEX 1100" film fabricated by Rogers Corporation, Chandler, Ariz., comprising an electrically conductive copper layer on a 25 to 125 μm thick polyimide insulator layer. The copper layer of the multilayer film is etched, routed, or milled to form an electrode 46 and integral electrical connector 30 configuration.

When the electrode 46 and integral electrical connector 30 are formed by etching, the etching process comprises the steps of (i) forming a protective resist layer patterned to correspond to the shape of the electrode 46 and electrical connector 30, over the electrically conductive layer of the multilayer film, and (ii) etching the resist protected multilayer film using conventional etching processes. The resist layer can be formed using photoresist materials, such as "RISTON" fabricated by DuPont de Nemours Chemical Co., Wilmington, Del., applied on the electrode layer. Conventional photolithographic methods, such as for example, those described in U.S. Pat. No. 4,952,528, to Abe, et al.; U.S. Pat. No. 5,079,600, to Schnur, et al.; U.S. Pat. No. 5,221,422, to Das, et al.—all of which are incorporated herein by this reference, can be used to pattern the resist layer on the electrically conductive layer. Conventional wet or dry chemical etching methods are used to etch the multilayer film. A suitable wet chemical etching method comprises immersing the multilayer film into an etchant such as ferric chloride, sodium persulfate, or an acid or base, until the unprotected portion of the electrode layer is etched. Suitable dry etching processes are described in, for example, U.S. Pat. Nos. 3,615,951, to Franco, et al.; 5,100,499, to Douglas; 5,167,748, to Hall, et al.; 5,185,058, to Cathey; 5,200,032, to Shinohara; 5,215,619, to Cheng, et al.; and 5,221,430, to Kadomura, et al.—all of which are incorporated herein by this reference.

After etching the electrically conductive layer to form the electrode 46 and integral electrical connector 30, a second insulative film is adhered over the conductive layer so that the conductive layer is embedded within an insulator. Suitable insulative films include, "KAPTON," a polyimide film manufactured by DuPont de Nemours Co., in Wilmington, Del.; "APIQUEO" fabricated by Kanegafuchi Chemical Indus., Japan; "UPILEX" manufactured by Ube Indus. Ltd., Japan; "NITOMID" fabricated by Nitto Electric Indus. Co. Ltd., Japan; and "SUPERIOR FILM" fabricated by Mitsubishi Plastics Indus. Ltd., Japan.

Alternative methods of fabricating the laminate member are described in aforementioned U.S. patent application Ser. No. 08/189,562.

Method of Using Chuck

Referring now to FIG. 1, a typical method of using the chuck 20 to hold a substrate 50 in a process chamber 36 is described. To effect the process, an electrostatic chuck 20 is placed on a support 60 in the chamber 36, and the process chamber 36 is evacuated to a pressure ranging from about 1 to about 500 mTorr, and more typically from about 10 to about 100 mTorr. A semiconductor substrate 50, such as a silicon wafer, is transferred to the chamber 36 from a load lock transfer chamber (not shown), and placed on the chuck 20. The voltage supply 62 is activated to apply a voltage to the electrostatic member 22 of the chuck 20, thereby electrically biasing the substrate 50. The resultant electrostatic force holds the substrate 50 to the chuck 20.

Process gas is introduced in the process chamber 36 using one or more sources of pressurized gas. The process gas can vary according to whether the substrate 50 is etched, or whether material is deposited on the substrate. For example, conventional halogen-containing etchant gases, such as for example, $Cl_2$, $BCl_3$, $CCl_4$, $SiCl_4$, $CF_4$, $NF_3$, and mixtures thereof, can be used to etch the substrate, as generally described in S. Wolf and R. N. Tauber, *Silicon Processing for the VLSI Era*, Vol. I, Chap. 16: Dry Etching for VLSI, Lattice Press, Sunset Beach, Calif. (1986), which is incorporated herein by reference.

The voltage supply is then activated to electrically bias the support 60 with respect to the grounded surface 66, thereby forming a plasma from the process gas in the chamber 36, for etching the substrate.

During the process, the removable plug substantially entirely covers, and protects, the electrical connector 30 of the chuck 20, thereby reducing erosion of the electrical connector 30, and increasing the lifetime of the chuck 20.

Although the present invention has been described in considerable detail with reference to certain preferred versions, many other versions should be apparent to those skilled in the art. Therefore, the spirit and scope of the appended claims should not be limited to the description of the preferred versions contained herein.

What is claimed is:

1. An erosion resistant electrostatic chuck for use in a process chamber containing erosive gas, the process chamber having a voltage supply source suitable for charging the chuck, the chuck comprising:

(a) an electrostatic member;

(b) a base supporting the electrostatic member, the base having a peripheral edge;

(c) a cutaway segment in the peripheral edge of the base;

(d) an insulated electrical connector in the cutaway for electrically connecting the electrostatic member on the base to the voltage supply in the process chamber; and (e) a removable plug in the cutaway, the plug covering a portion of the insulated electrical connector for protecting the insulated electrical connector from erosion in the process chamber.

2. The electrostatic chuck of claim 1, wherein the cutaway segment has a bottom and a side, and wherein the removable plug is substantially L-shaped with the bottom leg of the "L" in the bottom of the cutaway and the upstanding leg of the "L" abutting against the side of the cutaway.

3. The electrostatic chuck of claim 1, wherein the removable plug comprises a substantially erosion resistant material selected from the group consisting of metals, ceramics, and polymers.

4. The electrostatic chuck of claim 1, wherein the removable plug comprises a material selected from the group consisting of polyimide and anodized aluminum.

5. The electrostatic chuck of claim 1, further comprising an erosion resistant film disposed between the removable plug and the insulated electrical connector.

6. The electrostatic chuck of claim 5, wherein the erosion resistant film comprises polymer.

7. The electrostatic chuck of claim 6, wherein the erosion resistant film comprises polyimide.

8. The electrostatic chuck of claim 1, wherein the electrostatic member comprises an insulator with an electrode therein.

9. The electrostatic chuck of claim 1, wherein the base has a substrate support thereon, the substrate support being smaller than the base so that the base extends peripherally beyond the substrate support, and wherein the cutaway in the peripheral edge of the base extends into a portion of the substrate support that is adjacent to the cutaway.

10. An erosion resistant electrostatic chuck for use in a process chamber containing erosive gas, the process chamber having a voltage supply source suitable for charging the chuck, the chuck comprising:
   (a) an electrostatic member;
   (b) a base supporting the electrostatic member, the base having a peripheral edge;
   (c) a cutaway segment in the peripheral edge of the base, the cutaway segment having a bottom and a side;
   (d) an insulated electrical connector in the cutaway for electrically connecting the electrostatic member on the base to the voltage supply in the process chamber; and
   (e) a removable plug in the cutaway for protecting the insulated electrical connector from erosion in the process chamber, the removable plug being substantially L-shaped with the bottom leg of the "L" in the bottom of the cutaway and the upstanding leg of the "L" abutting against the side of the cutaway.

11. The electrostatic chuck of claim 10, wherein the removable plug is made from a material selected from the group consisting of metals, ceramics, and polymers.

12. The electrostatic chuck of claim 10, further comprising an erosion resistant film disposed between the removable plug and the insulated electrical connector.

13. A method of using an electrostatic chuck in a process chamber containing erosive gas, the process chamber having a voltage supply source suitable for charging the chuck, the method comprising the steps of:
   (a) placing an electrostatic chuck in the process chamber, the chuck comprising:
      (i) an electrostatic member;
      (ii) a base supporting the electrostatic member, the base having a peripheral edge;
      (iii) a cutaway segment in the peripheral edge of the base;
      (iv) an insulated electrical connector in the cutaway for electrically connecting the electrostatic member on the base to the voltage supply in the process chamber; and
   (b) placing a removable plug in the cutaway of the chuck so that the plug covers a portion of the insulated electrical connector in the cutaway for protecting the insulated electrical connector from erosion in the process chamber.

14. The method of claim 13, wherein the cutaway segment comprises a bottom and a side, and wherein the removable plug is substantially L-shaped with the bottom leg of the "L" in the bottom of the cutaway and the upstanding leg of the "L" abutting against the side of the cutaway.

15. The method of claim 14, wherein the removable plug comprises material selected from the group consisting of polyimide and anodized aluminum.

16. The method of claim 13, further comprising an erosion resistant film disposed between the removable plug and the insulated electrical connector.

17. The method of claim 16, wherein the removable plug comprises a material selected from the group consisting of polyimide and anodized aluminum.

* * * * *